United States Patent [19]

Spilsbury

[11] 4,302,708
[45] Nov. 24, 1981

[54] DEFLECTION AMPLIFIER SYSTEM FOR RASTER SCANNED CATHODE RAY TUBE DISPLAYS

[75] Inventor: Thomas W. Spilsbury, Phoenix, Ariz.

[73] Assignee: Sperry Corporation, New York, N.Y.

[21] Appl. No.: 135,372

[22] Filed: Mar. 31, 1980

[51] Int. Cl.³ .............................................. H01J 29/70
[52] U.S. Cl. .................................. 315/389; 315/388; 315/403
[58] Field of Search ........................ 315/388, 389, 403

[56] References Cited

U.S. PATENT DOCUMENTS 3,219,875 11/1965 Craven ................................ 315/389
3,767,964 10/1973 Varian ................................ 315/389

Primary Examiner—Malcolm F. Hubler
Attorney, Agent, or Firm—Howard P. Terry

[57] ABSTRACT

An efficient cathode ray deflection amplifier is provided having a selectable scan rate capability, providing sweep rate linearity through the use of a feed back arrangement that also cooperates in a self-adaptive manner with respect to commanded changes in the raster scan rate or display size.

6 Claims, 2 Drawing Figures

DEFLECTION AMPLIFIER SYSTEM FOR RASTER SCANNED CATHODE RAY TUBE DISPLAYS

BACKGROUND OF THE INVENTION

1. Field of the Invention

The invention relates to horizontal deflection amplifier systems and more particularly to linear deflection amplifier systems for use in raster scanned cathode ray tube displays requiring a selectively variable scan rate capability.

2. Description of the Prior Art

Prior art horizontal raster scanning cathode ray beam deflection amplifier systems have used linear a.c. coupled correction of resonant scanning circuits for achieving improved sweep linearity, but it has been necessary to achieve display size or magnification control from a separate control element. For example, when a change in display size or in the scan rate was to be commanded, a predetermined bias voltage was inserted to generate the increased or decreased fly back switch voltage in an open loop fashion. The functions of the prior art circuit normally interact so as not to remove certain undesired residual current levels that result in excess power loss and undesired heating of the deflection yoke and other circuit elements. Generally, it is also further desired to reduce the power required to drive such deflection systems, to improve sweep linearity, and to provide a fully compatible display size expand-compress function.

SUMMARY OF THE INVENTION

The present invention is an improved linear cathode ray beam deflection amplifier system which is self-adaptive to variable scan rate and display size. It provides sweep wave linearity through the use of feed back control and also, through the same feed back control, is self-adaptive with respect to commanded changes in raster scan rate or display size. It supplies an expand-contract or zoom function wherein the horizontal and vertical scans may be cooperatively lengthened or diminished by changing the fly back switching circuit voltage to drive the required increased or decreased current through the deflection coil. The novel display deflection amplifier system provides automatic response to line rate change or to expand-contract commands, while improving the inherent low power consumption advantages of the prior art resonant scan technique by d.c. coupling the sweep wave of the correction amplifier to the resonant scan circuit to produce an error signal that is fed forward to adjust the fly back pulse amplitude in a manner to reduce that error to zero and thereby also to provide the desired linear deflection yoke current.

DESCRIPTION OF THE PREFERRED EMBODIMENTS

Figure 1:
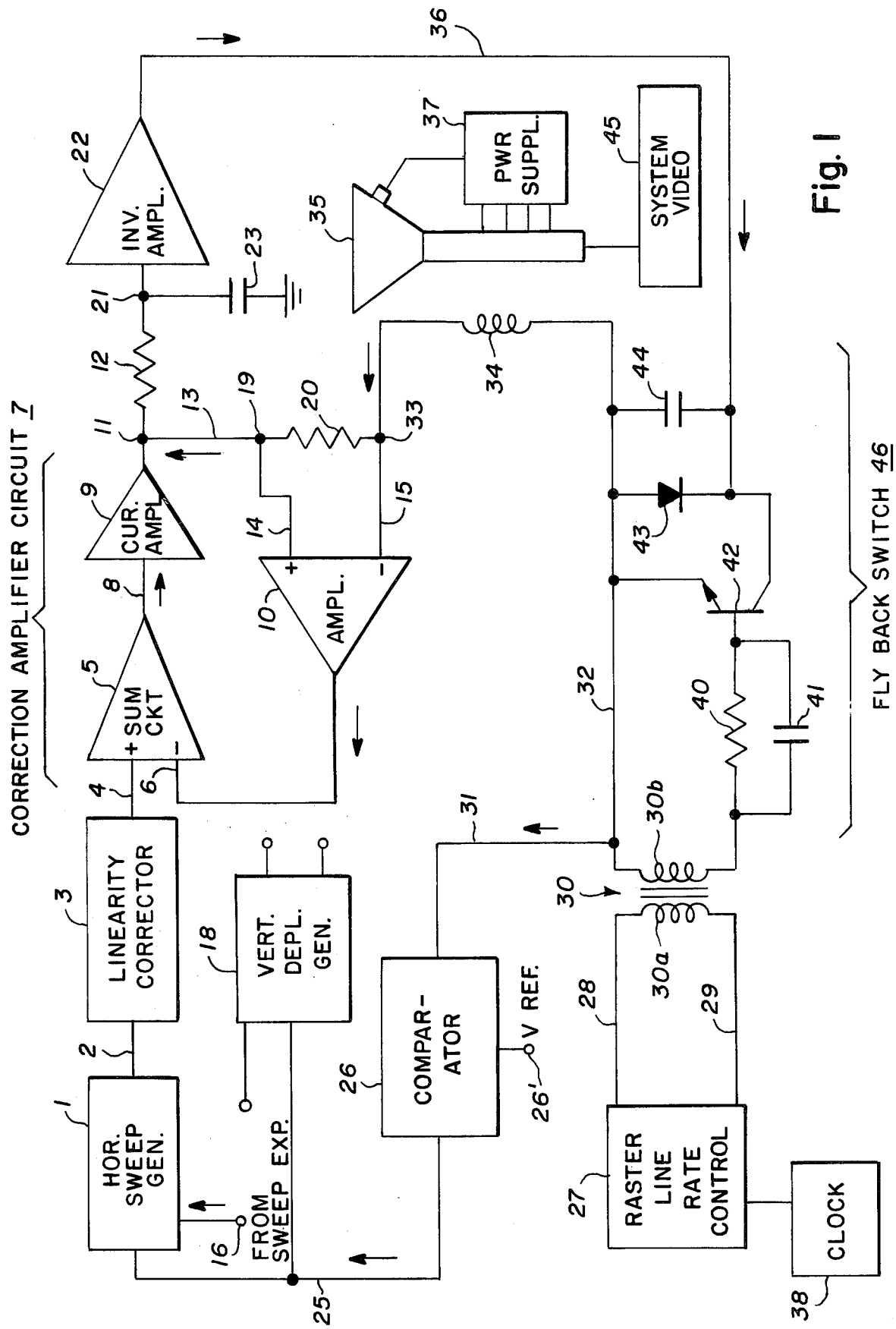
FIG. 1 is a schematic wiring diagram of a typical cathode ray beam deflection system illustrating how the invention may be employed and showing novel circuit components and their electrical interconnections.

FIG. 1 illustrates a horizontal magnetic electron beam deflection system typical of those in which the present invention may be employed to provide a capability for operating at a variable horizontal or other scan rate, such as selectively at scan rates of 525 or 875 lines. Such selectivity is needed, for example, in certain airborne indicators wherein a presentation having a first resolution is appropriate for one type of display and a second and higher resolution presentation is needed for a second type of display.

Operation of the invention is determined by the conventional pulse train synchronizer or raster line rate control 27 whose repetition rate or frequency is controlled conventionally by the system clock 38; the raster line frequency may be changed by a discrete command signal applied at terminal 39. The synchronizing train is coupled via leads 28,29 to the primary 30a of a pulse transformer 30 whose output winding 30b is coupled via leads 32 into resistor 40 and capacitor 41. One path includes the conventional fly back switching circuit 46, as will be further discussed.

A second current path is taken from lead 32 to one input 31 of a conventional amplitude comparator circuit 26 to which is coupled at a second input 26' a stable voltage reference. The consequent output error voltage pulses are coupled as trigger pulses by lead 25 to a conventional horizontal sweep voltage generator 1 having a sweep expansion command discrete input 16, and two conventional controlling inputs. Thus, pulses on lead 25 are delayed slightly with respect to those on lead 28, ensuring the proper phase relation between the sweep wave form on lead 2 and the fly back pulse on lead 32. The expansion command discrete input, coupled at terminal 16, permits conventional control of the expansion of the horizontal sweep. A conventional vertical blanking pulse, coupled at terminal 17 of vertical deflection generator 18 conventionally enables the vertical sweep wave. The linear slope saw tooth sweep output current of generator 1 is coupled by lead 2 to the shaping correction circuit 3 and thence, via lead 4, to one input of sum circuit 5 in the polarity indicated, along with a second input, yet to be discussed and found at lead 6. It is convenient to refer to sum circuit 5 and current amplifier 9 as a correction amplifier circuit 7.

The summation output on lead 8 is coupled to the conventional current amplifier 9, whose output is coupled through junction 11, resistor 12, and a junction 21 which is coupled by capacitor 23 to ground, to an inverting amplifier 22, and by lead 36 into one of the terminals of the conventional fly back switching circuit 46. A companion terminal of circuit 46 and lead 32 is coupled through the conventional cathode ray deflection coil 34 associated with cathode ray tube 35 and through resistor 20 and lead 13 to terminal 11 at the input of inverter amplifier 22. A voltage is derived across the terminals 19, 33 of resistor 20 and is applied to the respective input leads 14, 15 of sensing amplifier 10 to provide an output current on lead 6 proportional to this voltage which current, in turn, is connected to the second input of sum circuit 5.

It will be understood that the cathode ray tube 35 is associated with the usual power supply 37, and that video signals such as radar echo signals or other such information signals may be derived for it in conventional system video circuits represented schematically at 45.

The conventional fly back switching circuit 46 includes a lead 32 directly connecting the output of the transformer secondary 30b at lead 31 to one end of deflection coil 34. The opposite end of secondary 30b is coupled through the shunt connected resistor 40 and speed-up capacitor 41 to the base of fly back transistor 42, the emitter of which is connected to lead 32. The collector electrode of transistor 42 is coupled to lead 36 and through fly back diode 43 to lead 32. The fly back capacitor 44 is shunted across diode 43.

In considering the operation of the invention, it is convenient to note that the required voltage across deflection coil 34 is represented by the basic relation L (di/dt)+iR, and that the last term is the conventional voltage drop across resistor 20 and the resistance of coil 34. The L di/dt term includes two components:

(1) a small amplitude, high frequency a.c. component di'/dt normally held close to zero by the current sample fed back through amplifier 10 to the input of sum circuit 5, and (2) a component di"/dt produced by changes in current flowing through coil 34 caused by:

(a) size change commands injected by a size change discrete pulse at terminal 16 from a conventional source (increasing or decreasing the sweep ramp amplitude and detected through summing circuit 5, ) or (b) raster line frequency change command discrete exercised through the raster line rate control 27 (increasing or decreasing the fly back drive frequency and detected through the horizontal drive comparator 26 and summing circuit 5).

Figure 2:
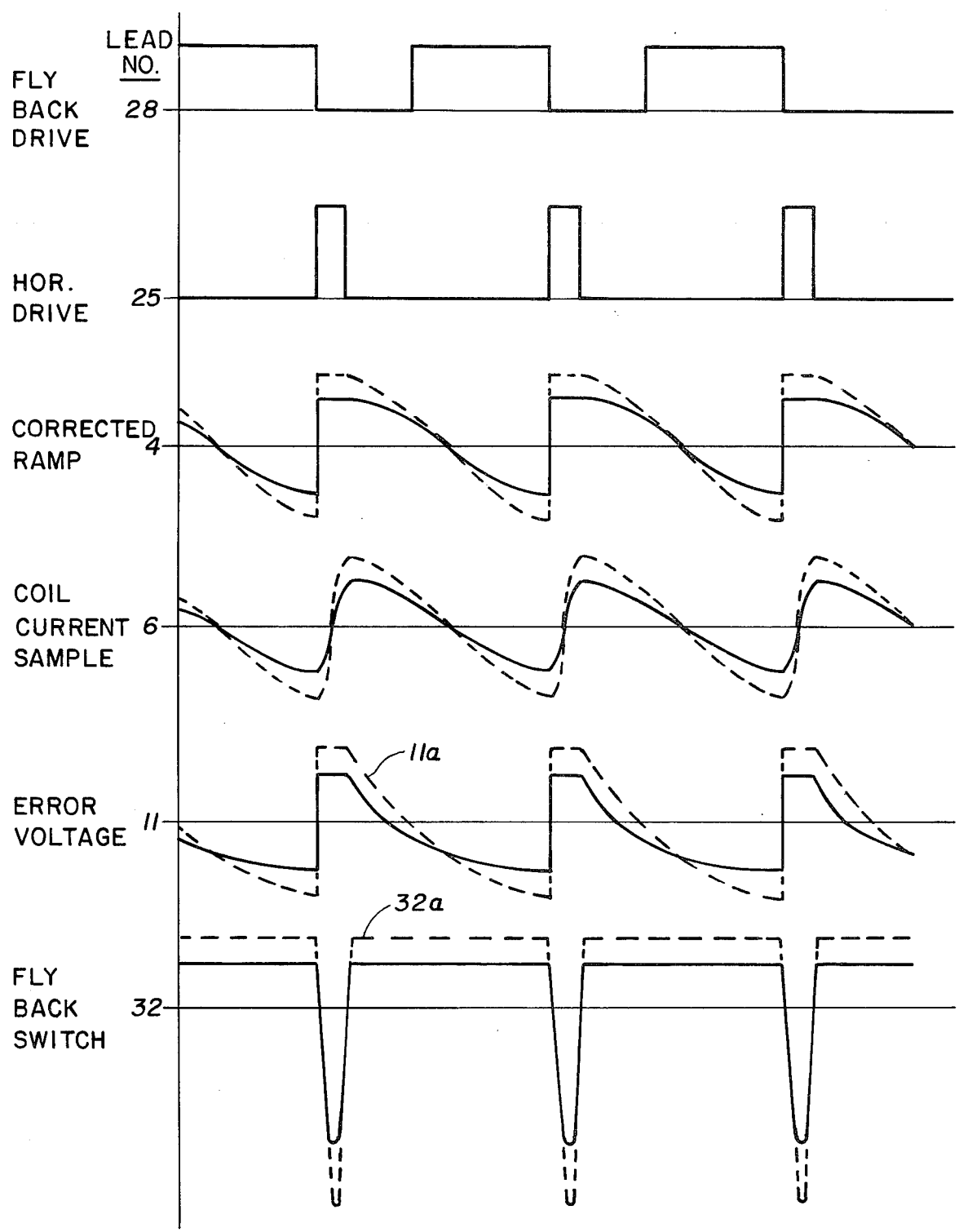
FIG. 2 illustrates significant wave forms found at indicated locations within FIG. 1.

Referring to FIGS. 1 and 2, operation of the invention will be considered; the raster line rate control 27 supplies a relatively square wave pulse train having a frequency of, say 15,750 Hz, for example, through transformer 30 to the conventional fly back switch circuit 46, which causes generation in that low power resonant scan circuit of a deflection driving current for application to coil 34. A horizontal deflection drive pulse train with pulses in phase with the fly back switching pulse is generated by the amplitude comparator 26 by comparison with a reference voltage on lead 26'. That drive pulse train appears on lead 25, the pulses having relatively short duration with respect to the pulses of lead 28. The pulse train on lead 25 is used to trigger and to synchronize each sweep of a repetitive sweep wave train formed by the conventional synchronized horizontal sweep generator 1.

The fly back circuit operates in a generally conventional manner; when the fly back transistor 42 is made conductive by a positive-going pulse on its base (coupled through transformer 30, resistor 40, and speed-up capacitor 41), coil current in 34 begins to increase linearly. When transistor 42 is turned off by a negative-going pulse coupled through transformer 30, coil current flows through fly back capacitor 44. This event produces a sinusoidal resonant fly back between the coil inductance and the capacitance of capacitor 44. After one half period of this resonant current, diode 43 becomes conductive and current decays linearly to zero, at which time the transistor is made conductive again.

The sawtooth output of generator 1 is shaped in the linearity correction circuit 3 to compensate in a conventional way for pin-cushion and other such tube geometry effects and to form a conventional cathode ray beam sweep current in lead 4, as seen in FIG. 2. The signal of lead 4 is applied to sum circuit 5 where it is, in effect, compared with the actual substantially linear deflection coil current sensed by the coil current sensing amplifier 10. The effective error signal at junction 11 is an alternating voltage including undesired components produced by the iR losses in the circuit path and by switching losses such as those in the fly back switching circuit 46, together with the desired deflection coil current error signal and the actual current through lead 13. It will be recognized that, as a matter of convenience, the variations in slopes of the wave forms in FIG. 2 are exaggerated.

It is seen that the iR and fly back switch circuit losses and the small amplitude a.c. errors are corrected by the conventional correction amplifier circuit 7 so that only large amplitude, low frequency a.c. signals at junction 11 are primarily the sweep error di"/dt. That error is coupled through inverter amplifier 22 and is fed back via lead 36 to the resonant scan fly back circuit 46, thereby to adjust the current through deflection coil 34 so as to reduce the error at junction 11 nearly to zero, thereby precisely providing the desired cathode ray beam deflection current.

Magnification of the central region of the cathode ray tube display is accomplished by lengthening the horizontal scan, the vertical scan length following automatically by virtue of the control of vertical deflection generator 18 by the pulsed wave train on lead 25. When a sweep expand command discrete signal is supplied to sweep generator 1 at terminal 16, the result is to increase the amplitude of the saw tooth wave output. It is to be observed that the expand (compress) command is accomplished at the sweep generator 1 and therefore before exercise of linearity correction in circuit 3, so that the operation of linearity corrector 3 is the same for all sweep wave amplitudes.

At the instant that the expand command is instituted, the fly back switch voltage has not yet changed and the deflection coil current and the current sense feed back signal remain essentially unchanged. Accordingly, a large error signal then appears at junction 11 (the dotted curve 11a in FIG. 2) corresponding to the aforementioned di"/dt term. This component is coupled through the low pass filter 12, 23 to inverter amplifier 22 to provide a corresponding increase in the voltage on lead 36. Voltage increase coupled to the fly back switching circuit 46 causes the deflection coil current 32a (FIG. 2) to change in an amount such as to increase the output of current sensing amplifier 10 until it has the same amplitude as the exapnded sweep input of sum circuit 5, thus reducing the error at junction 11 to substantially zero. It will be understood that removal of the expand discrete signal applied at terminal 16 will cause the described operation to reverse.

If it is desired further to change the resolution of the display by increasing the number of horizontal lines in the raster, for example, from 525 to 875 lines, such may be accomplished by supplying on the fly back circuit input lead 28 a pulse train having a pulse repetition rate of, say, 26,250 Hz. This provides 875 horizontal lines at a frame-to-field ratio of 30/60. The increase in pulse repetition frequency requires a corresponding increase in di/dt; because the increase is also applied to sweep generator 1 through comparator 26, the feed back operation of the deflection system adapts the voltage on lead 36 as previously described when size change is commanded.

Accordingly, it is seen that the invention overcomes the problems of the prior art by providing an improved cathode ray display deflection amplifier having a selectable variable scan rate capacity, providing sweep wave linearity through the use of feed back control which also cooperates in a self-adaptive closed-loop manner with respect to commanded changes in raster scan rate or display size. The novel deflection system reduces power consumption and has good sweep linearity. Once calibrated, the deflection system needs only the automatically provided changes in fly back pulse amplitude to provide the proper current to the beam deflection yoke.

While the invention has been described in its preferred embodiment, it is to be understood that the words which have been used are words of description rather than of limitation and that changes within the purview of the appended claims may be made without departing from the true scope and spirit of the invention in its broader aspects.

What is claimed is:

1. Apparatus for raster scanning of a cathode ray beam of a display device including:
    signal generator means for generating a first pulsed wave train selectively at least between a first and a second repetition frequency,
    first circuit means coupled to said signal generator means for generating a second pulsed wave train according to said selected frequency in the form of delayed trigger pulses,
    sweep generator means responsive to said first circuit means for generating a substantially linear sweep voltage wave train having a variable amplitude control,
    summation means having first input means responsive to said linear sweep generator means and having second input means,
    inverter amplifier means coupled by low pass filter means to the output of said summation means,
    fly back switching control means having first and second terminal means transformer-coupled to said signal generator means and having third and fourth terminal means,
    cathode ray beam deflection coil means associated with said display device,
    said first terminal means being directly coupled by conductor means to a first end of said cathode ray beam deflection coil means at said third terminal means,
    said inverter amplifier means having an output coupled to said fourth terminal means,
    said cathode ray beam deflection coil means being coupled at a second end thereof through first resistor means between said summation means and said low pass filter means, and
    second circuit means responsive to current flow through said first resistor means for supplying a signal representative thereof to said second input means.

2. Apparatus as described in claim 1 wherein said signal generator means comprises comparator means utilizing a voltage reference and said first pulse wave train for producing trigger pulses initiated at the end of each pulse of said first pulse wave train.

3. Apparatus as described in claim 2 wherein said second circuit means comprises:
    amplifier means coupled across said first resistor means, and
    second resistor means coupled between said amplifier means output and said second input means.

4. Apparatus as described in claim 2 further including wave shaping means interposed between said summation means and said low pass filter means.

5. Apparatus as described in claim 3 wherein said fly back switching control means includes, between said second and fourth terminal means:
    first capacitor means and second resistor means coupled in parallel,
    transistor means having a base coupled to said second resistor means and said first capacitor means, an emitter coupled to said conductor means, and a collector coupled to said fourth terminal means,
    diode means coupled between said collector means and said conductor means, and
    second capacitor means coupled between said collector means and said conductor means.

6. Cathode ray display horizontal deflection apparatus for generating a raster scanned display field having selectively variable scan parameters, said apparatus being of the transformer coupled, resonant fly back switch type and being self-adaptive to selection of said selected scan parameters comprising:
    horizontal deflecting coil means,
    resonant fly back switch means coupled with said deflection coil means for controlling the sweep current therethrough,
    sweep generator means for generating a substantially linear sweep signal,
    transformer means having an input responsive to a pulse wave of a predetermined frequency and an output coupled with both said fly back switch means and said sweep generator means,
    deflection coil current sampling means,
    differential means responsive to said sweep signal and said current sample means for providing an error signal, and
    means responsive to said error signal for further controlling said resonant fly back switch means for varying said deflection coil current in a manner to reduce said error signal to zero.

* * * * *